(12) United States Patent
Spears

(10) Patent No.: US 8,653,429 B2
(45) Date of Patent: *Feb. 18, 2014

(54) APPARATUS FOR CONTROLLING EXPOSURE OF LIGHT SENSITIVE ELEMENTS

(75) Inventor: Kurt Eugene Spears, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 296 days.

This patent is subject to a terminal disclaimer.

(21) Appl. No.: 13/149,637

(22) Filed: May 31, 2011

(65) Prior Publication Data

US 2012/0305748 A1   Dec. 6, 2012

(51) Int. Cl.
*G01J 1/32* (2006.01)
(52) U.S. Cl.
USPC ........................................ 250/205; 250/208.1
(58) Field of Classification Search
USPC ........... 250/208.1, 205, 214 R; 358/492–513; 348/294–324; 235/462.41, 462.23, 235/462.45, 462.07, 462.11; 382/317, 312; 355/67, 77
See application file for complete search history.

(56) References Cited

U.S. PATENT DOCUMENTS

| 4,852,972 | A | 8/1989 | Lo |
| 6,864,916 | B1 | 3/2005 | Nayar et al. |
| 7,333,250 | B2 | 2/2008 | Spears et al. |
| 7,503,498 | B2 | 3/2009 | Zhu et al. |
| 7,611,064 | B2 | 11/2009 | Zhu et al. |
| 8,405,750 | B2 * | 3/2013 | Smith et al. .................. 348/308 |
| 2011/0058082 | A1 | 3/2011 | Tay |

FOREIGN PATENT DOCUMENTS

KR   20050063857   6/2005

* cited by examiner

*Primary Examiner* — Que T Le

(57) ABSTRACT

Example embodiments disclosed herein relate to an imaging device. The imaging device includes a photosensor and an exposure system or developer. The exposure system or developer controls illumination or exposure of light sensitive elements of the photosensor based on their location within the photosensor.

14 Claims, 11 Drawing Sheets

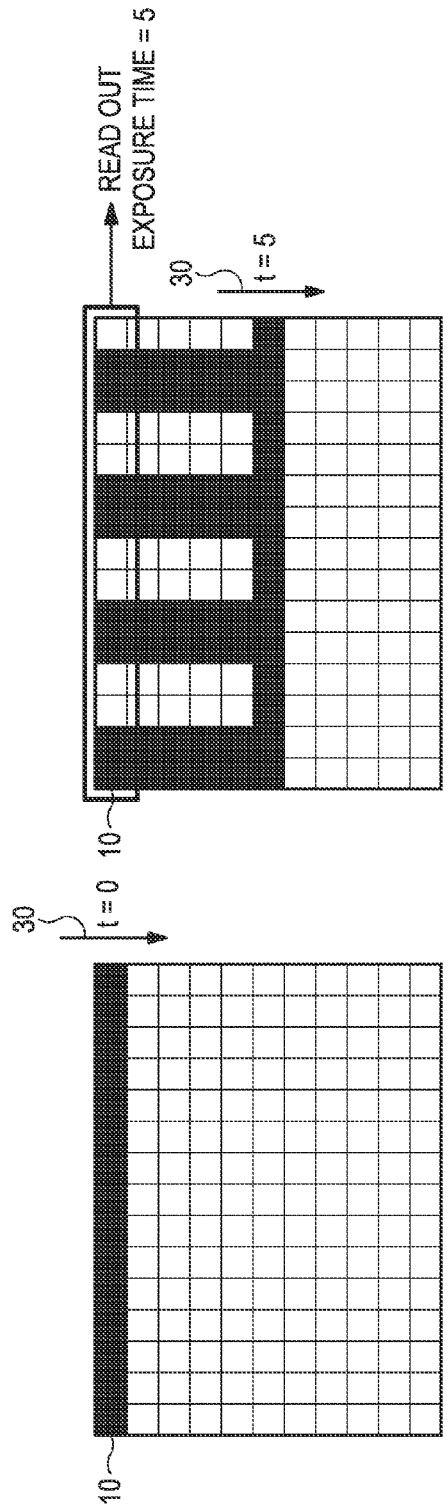
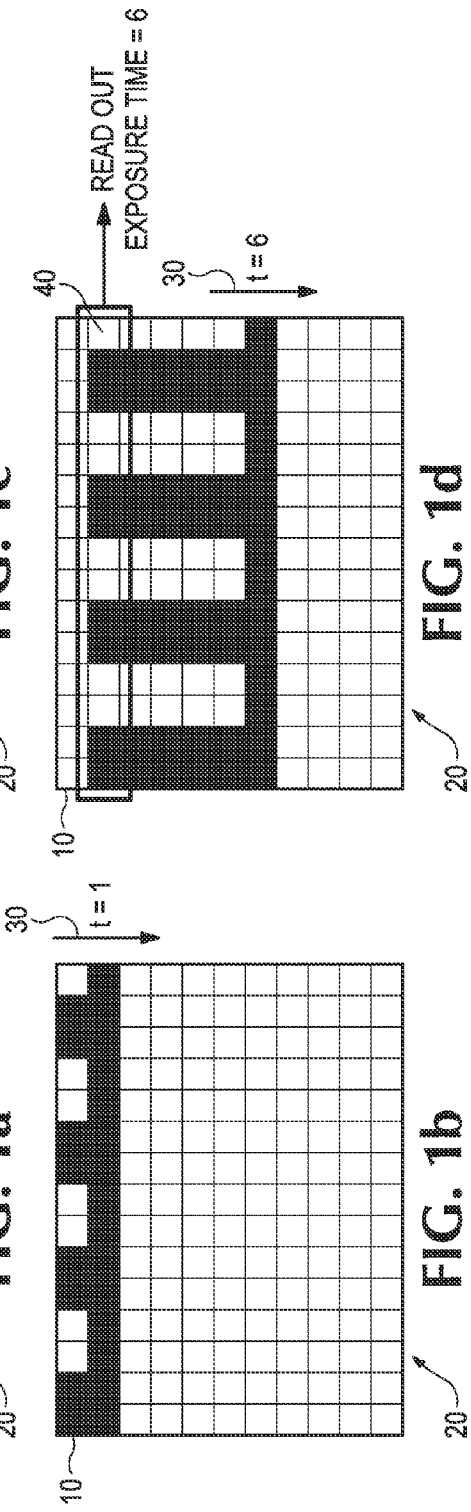

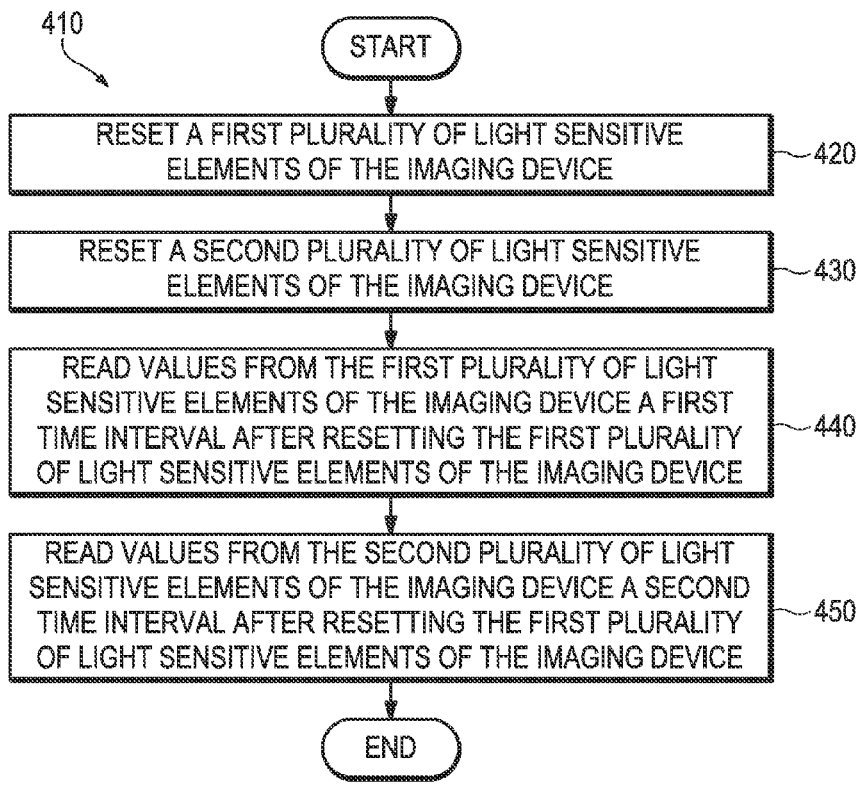

APPARATUS FOR CONTROLLING EXPOSURE OF LIGHT SENSITIVE ELEMENTS

BACKGROUND

A challenge exists to deliver quality and value to consumers, for example, by providing various capabilities in imaging and printing devices while maintaining cost effectiveness and output speed. Further, imaging and printing businesses may desire to enhance the functionality of their devices. For example, such businesses may desire to provide enhanced image reproduction capability without requiring additional effort on the part of such consumers.

BRIEF DESCRIPTION OF THE DRAWINGS

The following detailed description references the drawings, wherein:

FIGS. 1a-1d illustrate a rolling reset and rolling readout of a two-dimensional sensor array, as used in one example.

FIG. 11 is a block diagram and example of a method for use in an imaging device.

FIG. 12 is a block diagram and example of an additional element of the method shown in FIG. 11.

DETAILED DESCRIPTION

Imaging devices ideally capture images and reproduce them as accurately as possible. These captured images can include things such as photographs and scanned documents. However, realistic reproduction can be difficult because of challenges and limitations associated with a particular design.

For example, in some optical imaging systems, light from an image is focused by optics onto a two-dimensional sensor array. The two-dimensional sensor array is divided into rows of light sensitive pixels. A rolling reset first proceeds through the two-dimensional sensor array and successively resets each row. After an appropriate exposure time has elapsed, a rolling readout operation proceeds through the sensor array to capture the exposure value for the pixels in that array. An image is then constructed from these exposure values.

For example, as shown in FIG. 1a, a rolling reset starts at row one 10 of two-dimensional sensor 20, at time zero (t=0), and then proceeds down one row per time period in the direction of arrow 30, as shown in FIG. 1b. The time period is set to be the amount of time the system requires to read one row. In this example, the exposure time is set to five such that row one 10 is read out by the system after five time periods, as shown in FIG. 1c. Subsequently, row two 40 is read out at time six (t=6), as shown in FIG. 1d. In a typical system, all rows in the sensor array have an identical exposure duration using a combination of the rolling shutter and the subsequent rolling readout.

Figure 2:
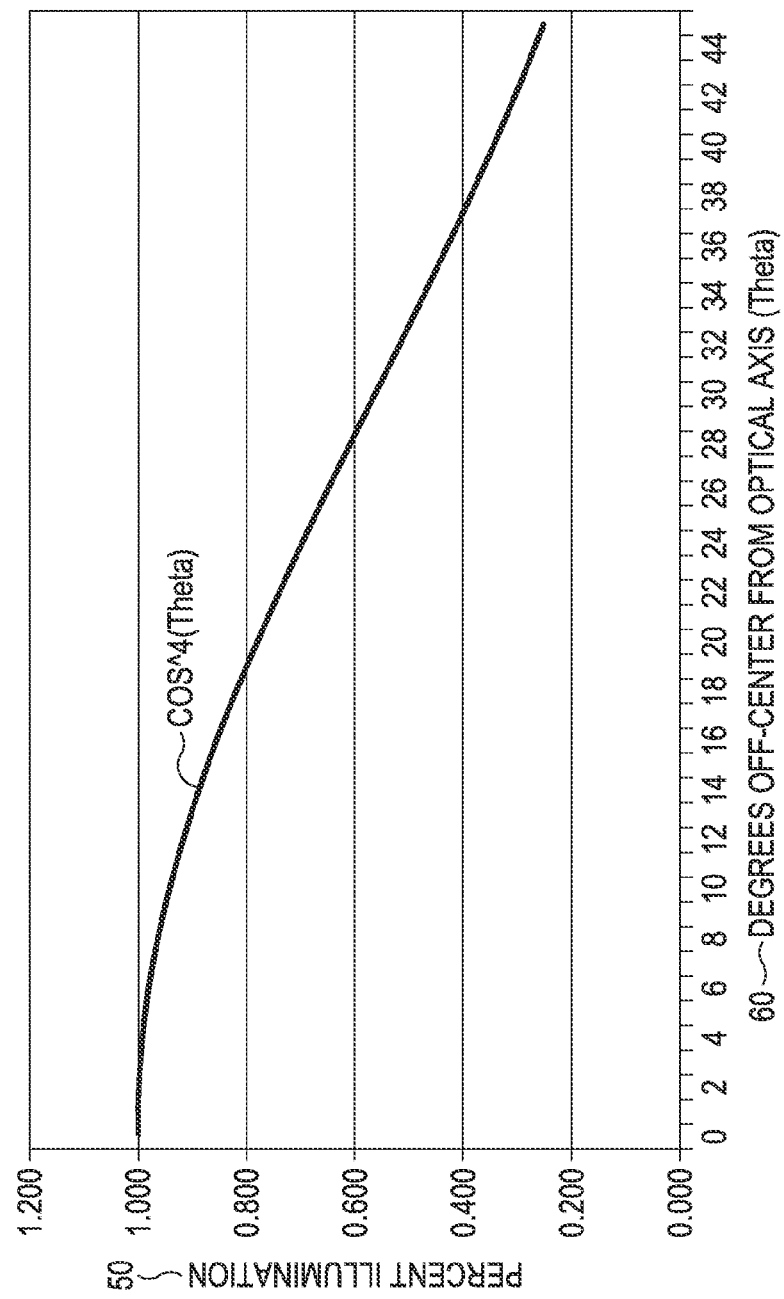
FIG. 2 is a graph illustrating a decrease of a percent of illumination intensity as a function of the cosine of the angle off-center from an optical axis, raised to the fourth power, as used in one example.

In such optical imaging systems, the collected light is lower for portions of an image off-center from the optical axis. The illumination intensity decreases as a function of the cosine of the angle off-center from the optical axis, raised to the fourth power. FIG. 2 illustrates this effect graphically where the percent illumination 50 is graphed as a function of the angle theta in degrees off-center from the optical axis 60.

This "cosine-four impact" causes the collected light and corresponding signal-to-noise ratio to be significantly lower for the outer portions of the image because illumination is controlled to prevent the central portion of an image from being saturated. This results in low image quality at the outer edges of the image. For systems using a two-dimensional imaging sensor, the signal-to-noise at the corners of the image can be more than three-times lower than the signal-to-noise in the center of the image.

In addition, non-uniformity of the illumination source can further reduce the signal-to-noise at the corners of the image. This occurs because in many illumination sources the output signal or intensity is typically brighter towards the center of an illuminated area and is reduced in intensity towards the edges of an illuminated area.

Figure 3:
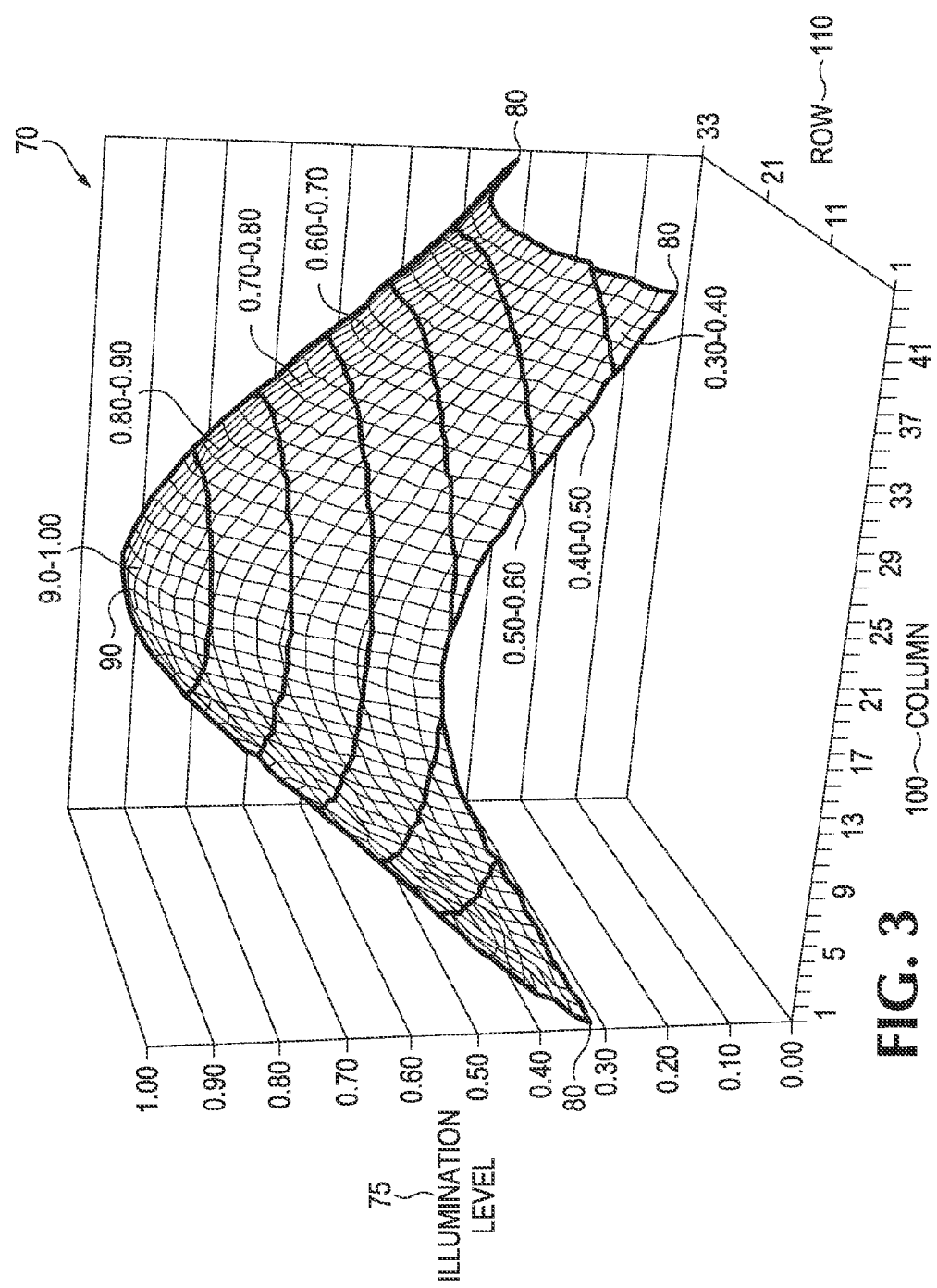
FIG. 3 shows the uncorrected illumination profile for a rectangular document captured by an 82 degree total field-of-view lens, prior to correction in one example.

FIG. 3 shows the uncorrected illumination profile 70 for a rectangular document captured by an 82 degree total field-of-view lens. For a uniform target, the illumination intensity or level 75 at the corners 80 of the image is approximately 32% of the illumination intensity at the center 90 of the optical field. FIG. 3 illustrates the results for an image sensor using a 44×33 grid (44 columns 100 and 33 rows 110) which corresponds to a 4:3 aspect ratio used in some image sensors.

A solution to this "cosine-four impact" is to apply analog or digital gain to the outer portions of the image to increase the signal and normalize the image. However, such a gain technique increases both the signal and the noise such that the signal-to-noise ratio of the outer portions is typically very poor. Alternatively, a system can capture multiple images with different illumination levels and construct a composite image. However, this method is computationally intensive and it is difficult to achieve proper uniformity and linearity in the image. It can also add cost due to the additional needed computing capability and can lower the speed at which images can be produced.

To optimize the signal-to-noise in the image, the illumination of the captured image should be as uniform as possible over the image field of the sensor. An example of an imaging device 120 designed with this goal in mind is shown in the block diagram of FIG. 4. Imaging device 120 includes a photosensor 130 and an exposure system or developer 140. Photosensor 130 includes a plurality of light or photo sensitive elements 150 that are arranged in an array or predetermined layout 160 so as to be positioned relative to a central location 170. In this particular example, layout 160 includes thirty-three (33) rows 180 and forty-four (44) columns 185. Exposure system 140 controls the duration of illumination of the light sensitive elements 150 of photosensor 130 based on their location within predetermined layout 160, as generally indicated by double arrow 165. For example, developer 140 may control the exposure of photosensitive elements of photosensor 130 based on their position relative to central location 170.

Exposure system 140 utilizes a variable exposure rolling shutter that consists of two synchronized events, a rolling reset and a rolling readout, as described earlier in FIGS. 1a-1d, both of which occur on array 160 of light or photosensitive elements 150. First the rolling reset proceeds through array 160 and successively resets each of the rows 180 to the same initial value. After the appropriate exposure time has elapsed, the rolling readout operation proceeds through each of the rows 180 of array 160. The rolling shutter exposure duration is varied by controlling the speeds of the rolling reset and rolling readout. If the rolling shutter proceeds through the array with a variable exposure based on either row or column, the illumination level of the image can be improved. This also helps to increase the signal-to-noise during image capture. For system simplification, the speed of the rolling reset can be varied. Doing so allows the rolling readout operation and electronics to perform the readout at a uniform speed.

Figure 5:
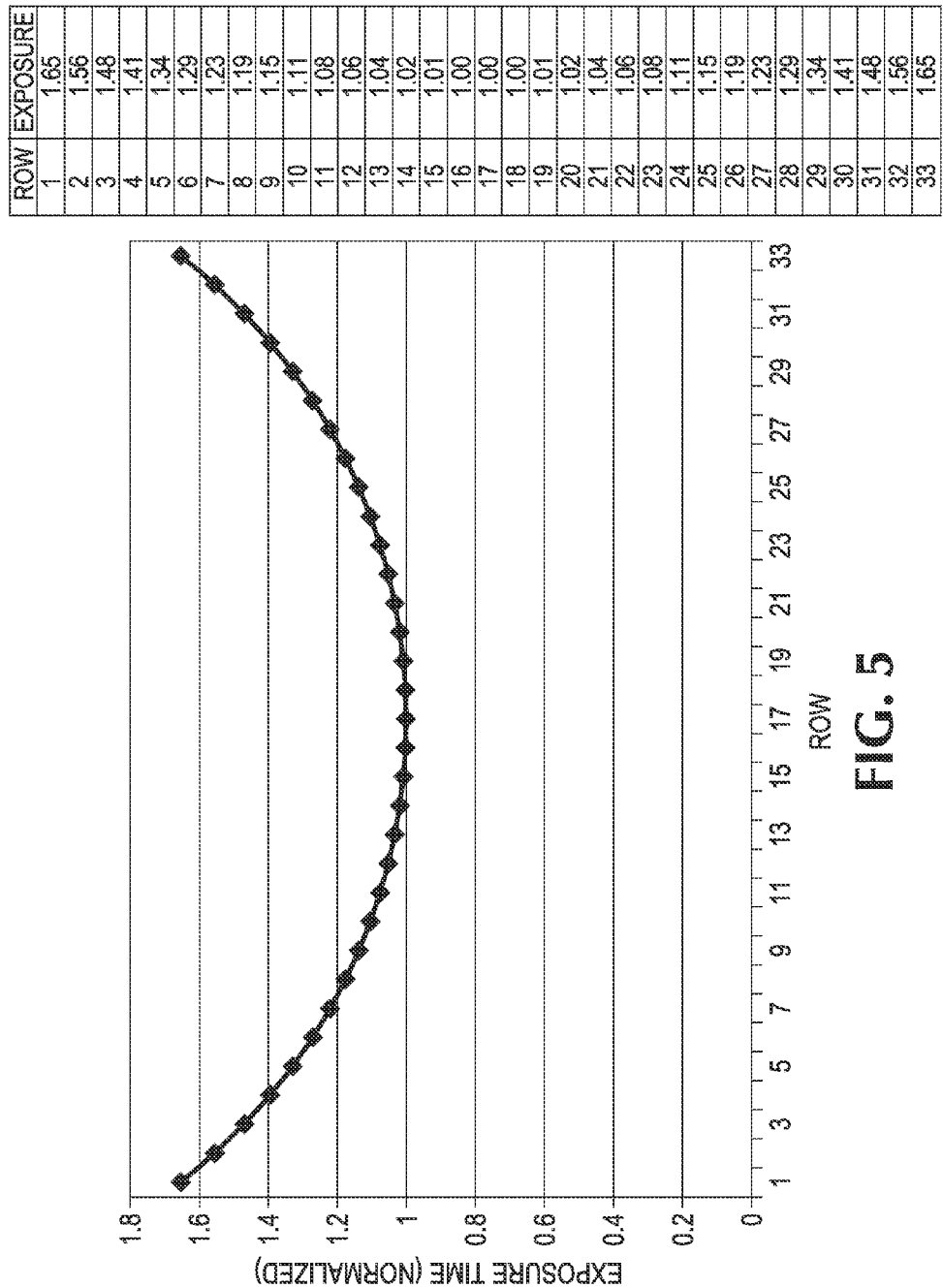
FIG. 5 is an example of an exposure time profile.

For example, because array or predetermined layout 160 is divided into thirty-three (33) rows 180, the exposure period of the first row can be set to 1.65 times the exposure period for the row at central location 170. The second row is then set to 1.56 times the exposure period for the row at central location 170. If the nominal exposure time is 10 milliseconds for central location 170, then the rolling reset will be allowed to start 10×1.65=16.5 milliseconds prior to the readout for the first row. Correspondingly, the reset of second row would start 15.6 milliseconds before the readout operation. The rolling reset is thus selected to move at a variable speed through the rows of array 160, as illustrated in FIG. 5. This helps optimize the exposure period for each row to get a nominal exposure. The nominal exposure is the amount of light that increases the center pixel of a row to be substantially similar to the pixels in the optical center of the field for a uniform target.

Figure 6:
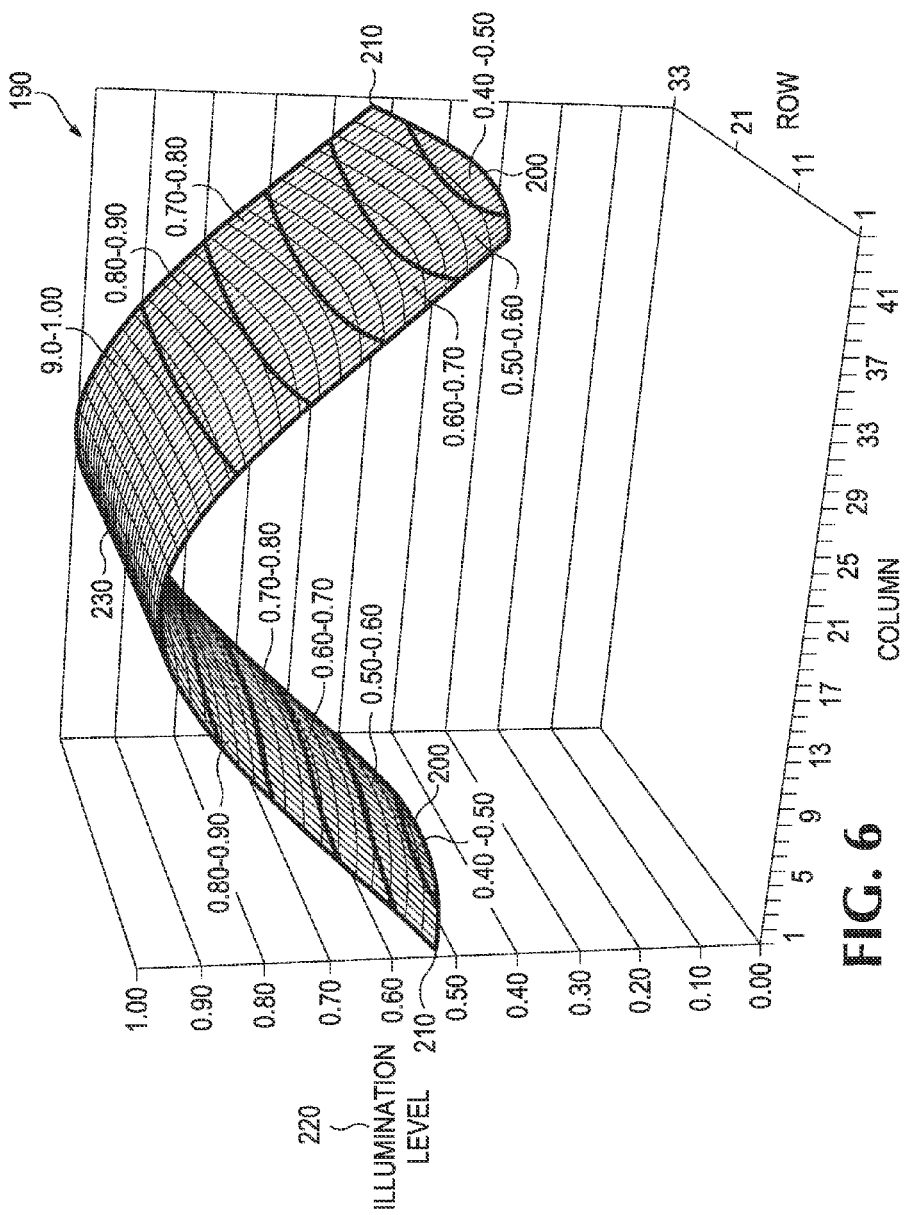
FIG. 6 shows an example of a corrected illumination profile for a rectangular document captured by an 82 degree total field-of-view lens.

If the rolling shutter proceeds through the rows 180 of array 160 with the exposure time profile shown in FIG. 5, the illumination at photosensor 130 is improved to the level shown in graph 190 of FIG. 6. With this implementation, the illumination level 220 at edges 200 is now the worst case as opposed to the corners 80 in the non-optimized system shown in FIG. 3. For corners 210 of the image represented by graph 190 shown in FIG. 6, the illumination ratio increases from approximately 32% to approximately 53%. This increases the signal-to-noise ratio by approximately 1.6× for corners 210. The worst case illumination is now located at edges 200 in row 17 and is approximately 46% of the central location 230 illumination level 220. The illumination level 220 remains substantially the same for central location 230 because the exposure time is substantially equal to the non-optimized system illustrated in FIG. 3.

Figure 7:
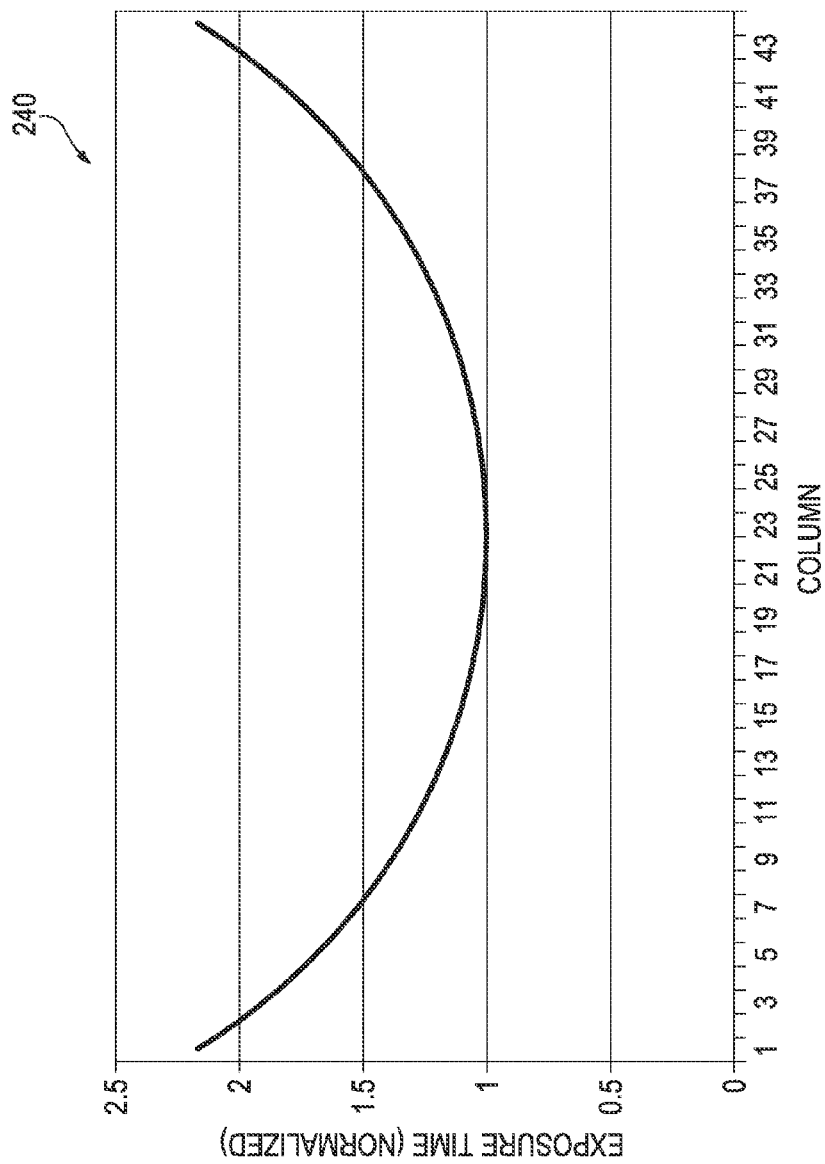
FIG. 7 is another example of an exposure time profile.
Figure 8:
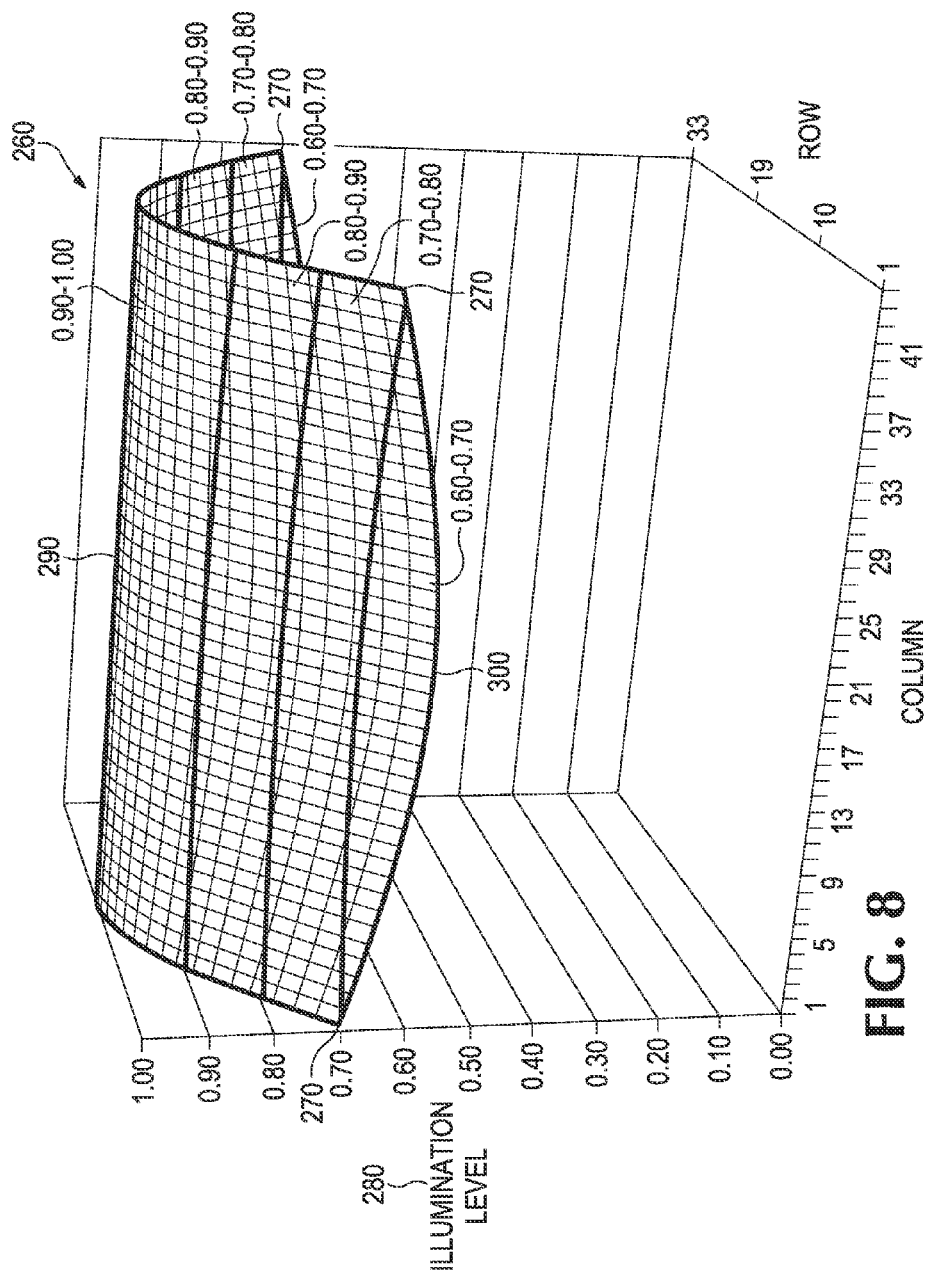
FIG. 8 shows another example of a corrected illumination profile for a rectangular document captured by an 82 degree total field-of-view lens.

As an alternative example, the rolling shutter can be designed to proceed, in an orthogonal direction to that illustrated in FIGS. 5 and 6, through the forty-four (44) columns 185 of array 160. This approach improves the illumination level of an image to an even greater extent than that illustrated in FIGS. 5 and 6. FIG. 7 shows an exposure time graph 240 utilizing this approach for each of the forty-four (44) columns 185 of array 160. FIG. 8 shows a graph 260 of the illumination profile at photosensor 130 that results from the utilization of these exposure times illustrated in FIG. 7 for the forty-four (44) columns 185 of array 160.

As can be seen in FIG. 8, the minimum illumination level 280 for the corners 270 of the image is approximately 70% versus approximately 32% for the non-optimized system shown in FIG. 3. This corresponds to an approximate 2.16× increase in signal-to-noise ratio of the corners 270. The illumination level remains substantially the same for the central location 290 because the exposure time is substantially equal to the non-optimized system shown in FIG. 3. However, the minimum illumination level 280 is approximately 61% for edges 300 of graph 260 for this optimized system versus approximately 32% for corners 80 of the non-optimized system illustrated in FIG. 3. This means the worst case signal-to-noise ratio is improved by approximately 90% for this implementation.

The exposure time profile and corresponding values for the rolling reset and rolling readout can be different from those values used in the examples provided above and discussed with respect to FIGS. 5-8. These values are selected to optimize the illumination level profile based on the particular characteristics of an imaging device (e.g., the field-of-view, geometry of the photosensor, etc.). These values can be determined in a variety ways and derived computationally as needed or stored in a look-up table.

Figure 4:
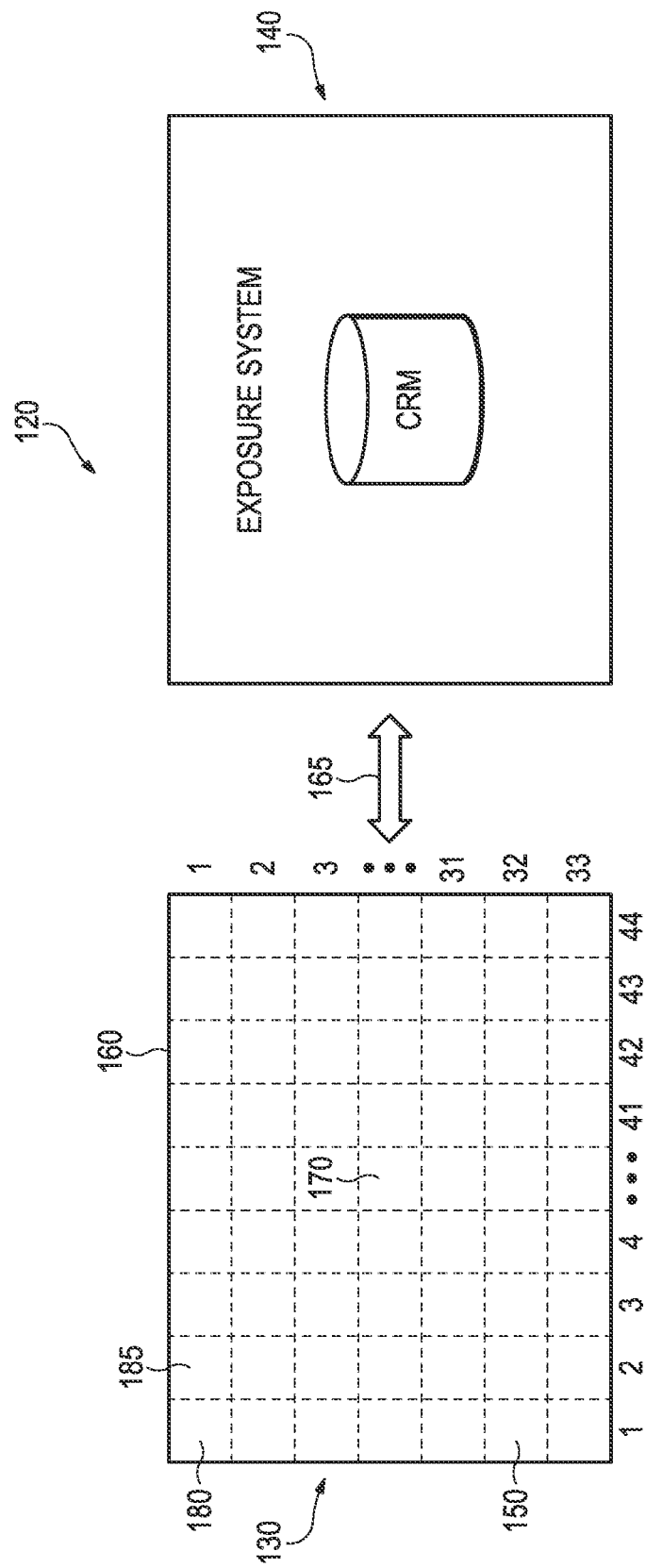
FIG. 4 is a block diagram and example of an imaging device.
Figure 9:
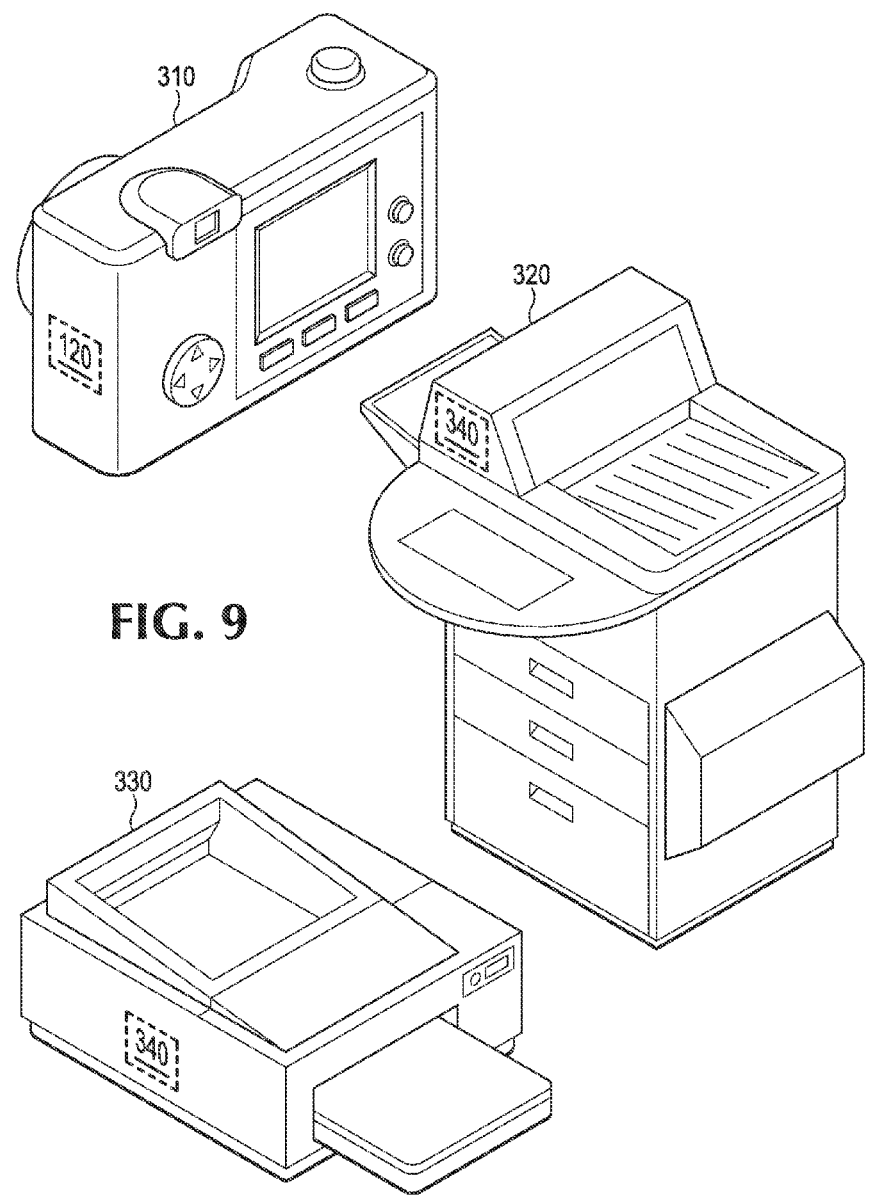
FIG. 9 illustrates examples of some of the devices in which the imaging device of FIG. 4 may be used.

As shown in FIG. 9, there are several applications for the imaging device 120 illustrated in FIG. 4. For example, it can be used in a camera 310, a printing device 320, and a scanner 330. Although not illustrated, it is to be understood that other applications are also possible.

Figure 10:
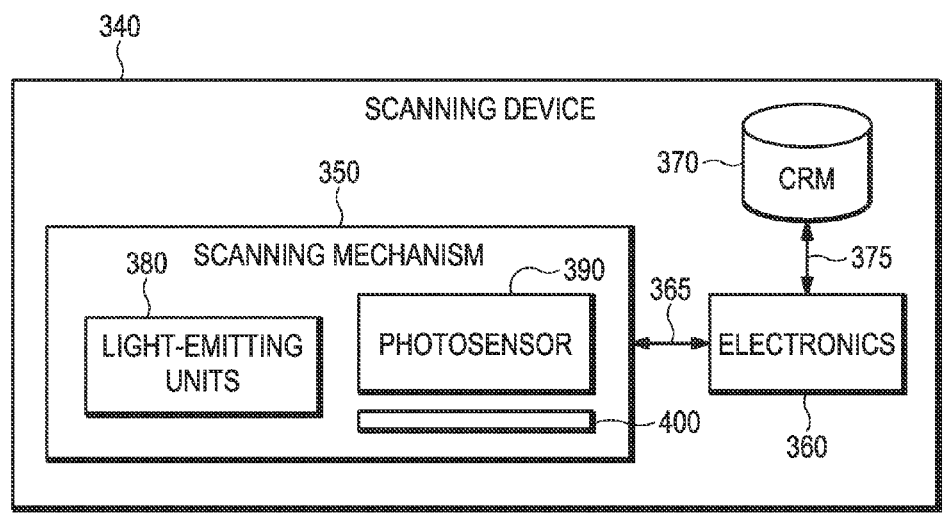
FIG. 10 illustrates an example of the application of the imaging device of FIG. 4 in either a printing device or scanner.

An example of the application of imaging device 120 in either printing device 320 or scanner 330 is illustrated in the block diagram of FIG. 10. FIG. 10 shows a scanning device 340 that includes a scanning mechanism 350, electronics 360 that control scanning mechanism 350, as generally indicated by double-arrow 365, and a non-transitory computer-readable medium (CRM) 370 accessible by electronics 360, as generally indicated by double-arrow 375. The scanning mechanism 350 includes one or more light-emitting units 380, a photosensor 390, and an optical element 400 that focuses an image on photosensor 390. Control electronics 360 can be of a variety of designs and include a processor that executes instructions stored on computer-readable medium 370. Optical element 400 can also be a variety of designs and include one or more lenses, mirrors, or a combination of the two. Photosensor 390 can additionally be a variety of designs such as a plurality of light-sensitive elements arranged in a predetermined layout or array. Non-transitory computer-readable medium 370 can include any type of memory device or combination thereof, such as a hard drive, read only memory (ROM), random access memory (RAM), flash drive, etc.

An example of a method 410 for use in an imaging device 120 is illustrated in FIG. 11. Method 410 begins by resetting a first plurality of light sensitive elements of the imaging device as shown by block 420. Next, method 410 proceeds by resetting a second plurality of light sensitive elements of the imaging device as shown by block 430 in FIG. 11. Method 410 then reads the values from the first plurality of light sensitive elements of imaging device 120 a first time interval after resetting them, as shown by block 440 of FIG. 11. The values read from the first plurality of light sensitive elements may be indicative of the quantity of light collected after resetting. Next, values from the second plurality of light sensitive elements are read a second time interval after resetting the first plurality of light sensitive elements of the imaging device 120, as shown by block 450 of FIG. 11. The durations of the first and second time intervals may be selected to compensate for light fall-off at the outer edges of imaging device 120. Finally, method 410 concludes by constructing an image based upon the values read from the first set of light sensitive elements and the values read from the second set of light sensitive elements, as indicated by block 460 of FIG. 11.

Although several examples have been described and illustrated in detail, it is to be clearly understood that the same are intended by way of illustration and example only. These examples are not intended to be exhaustive or to limit the invention to the precise form or to the exemplary embodiments disclosed. Modifications and variations may well be apparent to those of ordinary skill in the art. For example, although not shown, the rolling shutter can be designed to proceed in multiple directions through a photosensor (e.g., through both the rows and columns of an array), rather than just one direction. As an additional example, the rolling readout operation can be performed at a varying speed, rather than a uniform one. As a further example, the initial reset of photosensitive elements within a photosensor can be to different values, rather than to the same value. As yet another example, exposure system 140 may include a non-transitory computer-readable medium (CRM) 125, as generally indicated in FIG. 4. The spirit and scope of the present invention are to be limited only by the terms of the following claims.

Additionally, reference to an element in the singular is not intended to mean one and only one, unless explicitly so stated, but rather means one or more. Moreover, no element or component is intended to be dedicated to the public regardless of whether the element or component is explicitly recited in the following claims.

What is claimed is:

1. An apparatus, comprising:
 a photosensor having a plurality of light sensitive elements arranged in a predetermined layout; and
 an exposure system that controls duration of illumination of the light sensitive elements based on location of the light sensitive elements within the predetermined layout.

2. The apparatus of claim 1, wherein the light sensitive elements of e photosensor are arranged in an array of rows and columns.

3. The apparatus of claim 2, wherein the exposure system varies duration of illumination based on a location of the row in the array.

4. The apparatus of claim 2, wherein the exposure system varies duration of illumination based on a location of the column in the array.

5. The apparatus of claim 1, further comprising an optical element that focuses an image on the photosensor.

6. The apparatus of claim 1, further comprising one of a printing device, scanner, and camera including the photosensor and exposure system.

7. An imaging device, comprising:
 an array of photosensitive elements positioned relative to a central location; and
 a developer that controls exposure of individual photosensitive elements based on distance from the central location.

8. The imaging device of claim 7, wherein the developer controls exposure of the photosensitive element by setting at least one of the photosensitive elements at a first predetermined time to an initial state indicative of zero light collection.

9. The imaging device of claim 8, wherein the developer further controls exposure of the at least one photosensitive element by measuring a value at the at least one photosensitive element at a second predetermined time, the value indicative of a quantity of light collected by the at least one photosensitive element.

10. The imaging device of claim 7, wherein the developer increases a time of exposure for the photosensitive elements as a distance from the central location increases.

11. The imaging device of claim 7, further comprising an optical element that focuses an image on the array of photosensitive elements.

12. The imaging device of claim 11, further comprising a reset operation that proceeds through the array of photosensitive elements and a readout operation that proceeds through the array of photosensitive elements.

13. The imaging device of claim 12, wherein the reset operation is performed at varying speed.

14. The imaging device of claim 7, further comprising one of a printing device, scanner, and camera including the array of photosensitive elements and the developer.

* * * * *

UNITED STATES PATENT AND TRADEMARK OFFICE
CERTIFICATE OF CORRECTION

| | |
|---|---|
| PATENT NO. | : 8,653,429 B2 |
| APPLICATION NO. | : 13/149637 |
| DATED | : February 18, 2014 |
| INVENTOR(S) | : Kurt Eugene Spears |

It is certified that error appears in the above-identified patent and that said Letters Patent is hereby corrected as shown below:

In the Claims:

In column 5, line 36, in Claim 2, delete "of e" and insert -- of the --, therefor.

Signed and Sealed this
Tenth Day of June, 2014

Michelle K. Lee
*Deputy Director of the United States Patent and Trademark Office*